United States Patent [19]

Tsukada et al.

[11] Patent Number: 5,266,825
[45] Date of Patent: Nov. 30, 1993

[54] THIN-FILM DEVICE

[75] Inventors: Toshihisa Tsukada, Musashino; Yoshiyuki Kaneko, Hachioji, both of Japan

[73] Assignee: Hitachi, Ltd., Tokyo, Japan

[21] Appl. No.: 864,937

[22] Filed: Apr. 7, 1992

Related U.S. Application Data

[62] Division of Ser. No. 597,323, Oct. 15, 1990, Pat. No. 5,153,690.

[30] Foreign Application Priority Data

Oct. 18, 1989 [JP] Japan .................................. 1-268932
Dec. 25, 1989 [JP] Japan .................................. 1-332839

[51] Int. Cl.$^5$ ..................... H01L 27/01; H01L 29/78; H01L 27/12; G02F 1/13
[52] U.S. Cl. ..................... 257/366; 257/350; 257/401; 257/444; 257/532; 257/57; 250/331
[58] Field of Search .............. 357/2, 4, 23.7, 23.14, 357/23.15, 51; 250/331; 257/350, 365, 366, 379, 401, 443, 448, 444, 532, 57, 59, 410

[56] References Cited

U.S. PATENT DOCUMENTS 4,984,041 1/1991 Hack et al. .................. 257/61

Primary Examiner—Mark V. Prenty
Attorney, Agent, or Firm—Antonelli, Terry, Stout & Kraus

[57] ABSTRACT

A thin-film transistor using hydrogenated amorphous silicon (a-Si:H), and particularly a thin-film device such as a thin-film transistor having high conductivity, large drivability and high process margin, and a display panel using the same transistors. The object of the invention is to reduce defects due to shorts between the gate and the source or between the gate and the drain, to prevent signal line defect even in case defects develop due to shorts, and to expand the design margin and process margin in the array. A capacity is connected to the gate electrode of the channel side and a voltage is applied to the gate electrode via the capacity.

35 Claims, 5 Drawing Sheets

THIN-FILM DEVICE

This application is a division of application Ser. No. 07/597,323, filed Oct. 15, 1990, now U.S. Pat. No. 5,153,690.

BACKGROUND OF THE INVENTION

The present invention relates to a thin-film transistor using hydrogenated amorphous silicon (a-Si:H) and to a thin-film device such as a display panel of the active matrix type using the thin-film transistors. More specifically, the invention relates to a thin-film transistor that has large conductivity and large drivability (large mutual conductance), a large process margin and little defects due to shorts between electrodes, and to a thin-film device such as a display panel using the thin-film transistors.

Conventional thin-film transistors are formed on an insulating substrate, and are constituted by a gate electrode, a gate insulator, a semiconductor layer, a source electrode and a drain electrode, and in which a bias voltage is applied to the source, drain and gate electrodes during its operation to flow an electric current to the channel as disclosed in, for example, Japanese Patent Laid-Open No. 26861/1987.

SUMMARY OF THE INVENTION

The present inventors have studied the above-mentioned conventional structure and have found problems as described below.

The above prior art represents an inverse-stagger-type thin-film transistor having a gate electrode provided at the lower portion, which is the most generally employed constitution of the thin-film transistor. In the thus constituted transistor, however, the source electrode and the gate electrode or the drain electrode and the gate electrode must have an overlapping region in order to maintain transistor characteristics. In particular, the on-current does not take a high value unless an overlapping region of at least about 2 μm is provided between the source electrode and the gate electrode. The overlapping, however, becomes a cause of defects due to shorts between electrodes of the transistor. That is, the presence of any foreign particle could cause defects due to shorts between the source and the gate or between the drain and the gate. The defects develop more easily as the thickness of the gate insulator decreases, and limitation is imposed on increasing the mutual conductance of the transistor by decreasing the thickness of the insulating film.

According to a thin-film transistor disclosed in U.S. Application No. 07/480022 filed previously and now abandoned, the gate electrode is comprised of two layers, i.e., a first gate electrode and a second gate electrode, and the same voltage is applied to these two gate electrodes to operate the transistor.

The above previous application makes it possible to effectively increase the mobility of the thin-film transistor by three to five times while permitting the transistor to exhibit improved reliability. In the above previous application, however, the thickness of the insulating film must be decreased between the second gate electrode and the channel region, still giving rise to the occurrence of defects due to shorts between the gate and the source or between the gate and the drain. Therefore, there is little design margin or process margin, and problem arises when the elements are applied in an integrated form to the active matrix liquid crystal display and the like.

According to the present invention, a coupling capacity is connected in series with the gate electrode of a thin-film transistor as a unitary structure, and a bias voltage is applied to the electrode via the coupling capacity.

In order to improve the yield of transistors, in this case, the coupling capacity is formed outside the channel region of the transistor as viewed or a plane. This constitution is effective particularly when the transistors are arrayed.

To facilitate the construction of the coupling capacity as a unitary structure, furthermore, the semiconductor layer is composed of amorphous silicon, and the hetero-interface between thin films is made flexible. In order to decrease the impedance of the coupling capacity, furthermore, a film should be used which is composed of a material having a large relative permittivity and a relatively large dielectric loss tan δ.

According to the present invention, furthermore, a capacity is connected to the gate electrode (second gate electrode) of the channel side, and a voltage is applied to the second gate via this capacity. Concretely speaking, a capacity is formed between the first gate and the second gate on the outside of the channel region of the thin-film transistor.

To facilitate the fabrication of double-gate structure, furthermore, amorphous silicon that enables multi-layer film to be easily formed is used as an active semiconductor layer.

In order to simplify the process, furthermore, the insulating film between the first gate and the second gate is used in common for the transistor portion and the coupling capacitor portion.

According to the present invention as described above, the coupling capacity is connected in series with the gate electrode as a unitary structure. The bias voltage is applied to the gate via the coupling capacity, and whereby part of the bias voltage is applied to the coupling capacity. When the coupling capacity is greater than the capacity of the gate insulator, however, the voltage is applied at a small ratio to the coupling capacity and there arises no problem. With the constitution of the present invention, furthermore, it is allowed to increase the mutual conductance of the transistor and, hence, to lower the operation voltage. Therefore, the applied voltage as a whole can be further lowered than that of the case of the conventional thin-film transistors.

The coupling capacity is provided on the outside of the channel region of the transistor as viewed on a plane but being juxtaposed to the channel region. Therefore, even in case there develop defects due to shorts between the source and the gate or between the drain and the gate of the transistor being caused by the presence of foreign matter, entire shorts (defects in the signal lines) do not result since the coupling capacity is located separately from the channel portion.

Moreover, since defects due to shorts do not develop so easily, the gate insulating film of the channel portion may be made thinner than that of the conventional thin-film transistors to increase the mutual conductance of the transistor. An increase in the mutual conductance is equivalent to a decrease in the ratio W/L of the channel width to the channel length of the transistor, enabling the area occupied by the transistor to be further decreased and, hence, probability of defects such as shorts due to foreign particle to be further decreased.

According to the present invention, furthermore, the gate electrode is divided into two, and the gate insulator on the second gate electrode is thinner than the insulator on the first gate electrode. This is effective in increasing the effective mobility of the transistor but results in an increased probability of defects due to shorts between the second gate electrode and the source or the drain electrode. In an ordinary constitution, it can be expected that there is no problem since there is provided an offset region between the source or drain and the second gate electrode. In practice, however, the source or drain and the second gate are on the line or are overlapped due to the masking margin, and defects due to shorts develop.

According to the present invention, the second gate electrode is not directly connected to the first gate electrode but is connected thereto via a capacitor. Therefore, even if a short develops between the source or drain and the second gate, it does not readily result in a short between the first gate and the source or drain.

The object of the present invention is to solve the above-mentioned problems inherent in the prior art.

The object of the present invention is to reduce defects due to shorts between the gate and the source or between the gate and the drain.

A further object of the present invention is to expand the design margin in the array.

A still further object of the present invention is to expand the process margin in the array.

An yet further object of the present invention is to increase the mutual conductance of the transistor by decreasing the thickness of the insulator.

Another object of the present invention is to provide a thin-film transistor in which even if a defect develops due to a short in a portion where the gate electrode and other electrodes are overlapped, the signal line does not become entirely defective, and to provide a display panel using the same transistors.

That is, the object of the present invention is to provide a thin-film device that features improved reliability and improved yield of production.

These and other objects and many of the attendant advantages of this invention will be readily appreciated as the same becomes better understood by reference to the following detailed description when considered in connection with the accompanying drawings.

DETAILED DESCRIPTION OF THE INVENTION

The thin-film transistor which is a thin-film device and a display panel using the same of the present invention will now be concretely described by way of embodiments.

Embodiment 1

Figure 1A:
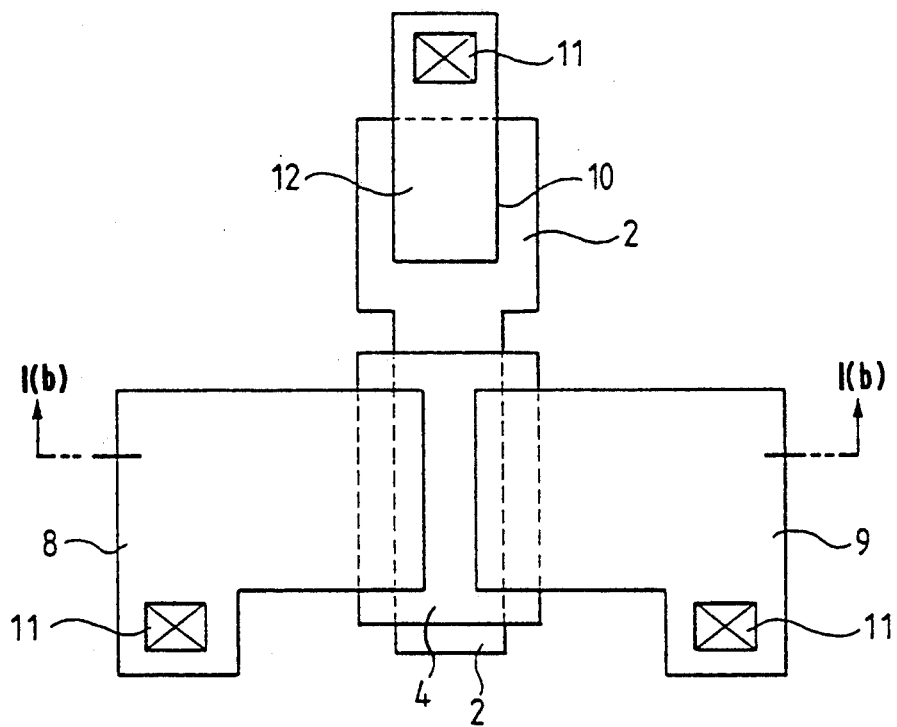
FIG. 1(a) is a plan view illustrating the constitution of an embodiment of a thin-film transistor which is a thin-film device of the present invention.
Figure 1B:
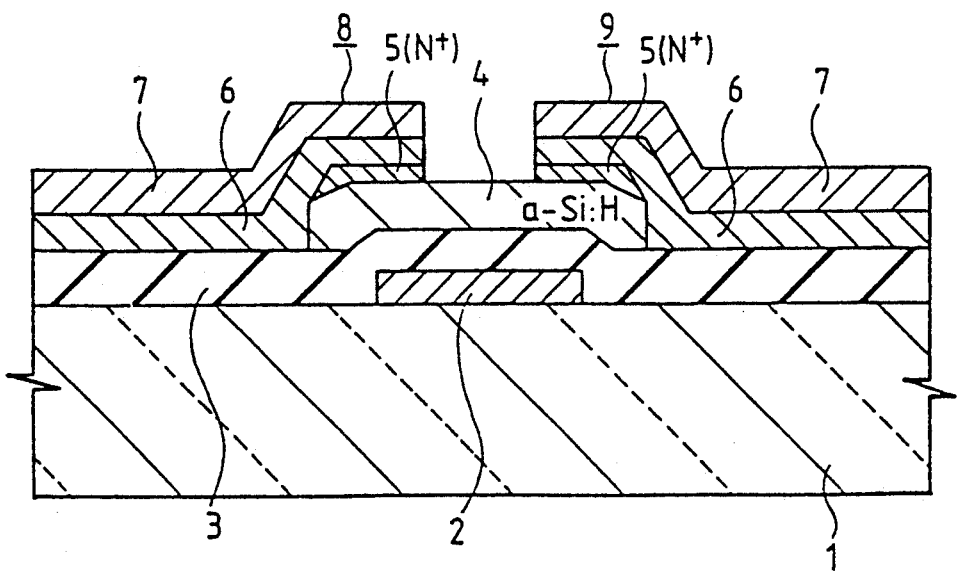
FIG. 1(b) is a section view along A-A' of FIG. 1(a)

FIGS. 1(a) and 1(b) are diagrams illustrating the constitution of an embodiment of a thin-film transistor of the present invention, wherein FIG. 1(a) is a plan view and FIG. 1(b) is a section view along A-A' of FIG. 1(a), showing a hydrogenated amorphous silicon thin-film transistor (a-Si:H TFT) formed on a glass substrate 1. In the following embodiment, reference numeral 1 denotes a substrate, 2 denotes a gate electrode, 3 denotes a gate insulator, 4 denotes a semiconductor layer, 5 denotes an ohmic contact layer, 6 denotes a chromium layer, 7 denotes an aluminum layer, 8 denotes a source electrode, 9 denotes a drain electrode, 10 denotes a coupling capacity-forming electrode, 11 denotes a contact hole, 12 denotes a coupling capacity, 13 denotes an aluminum layer, 14 denotes an $Al_2O_3$ layer, 15 denotes a liquid crystal, 16 denotes a thin-film transistor, 17 denotes a vertical shift register, 18 denotes a horizontal shift register, 19 denotes a gate bus line which is a gate signal line, 20 denotes a data line which is a video signal line, 21 denotes a transparent pixel electrode, and 22 denotes an electrode for pixel.

The transistor has a semiconductor layer 4 which is composed of a-Si:H, has the source electrode 8, the drain electrode 9, the gate electrode 2, and the coupling capacity 12 that is connected in series with the gate electrode.

Described below is a procedure for fabricating the thin-film transistor. First, chromium is deposited maintaining a thickness of 1000 angstroms on a glass substrate 1 which is an electrically insulating substrate, and the gate electrode 2 is patterned using an ordinary photolithography method. Then, using the plasma CVD method, an SiN film is deposited maintaining a thickness of 1500 angstroms to form the gate insulator 3, an a-Si:H film is deposited maintaining a thickness of 1500 angstroms to form the semiconductor layer 4, and an n+a-Si:H film is deposited maintaining a thickness of 400 angstroms to form the ohmic contact layer 5, all continuously. Here, the plasma CVD method is carried out while changing the kind of gas in the same chamber, and the kind of gas is changed by once evacuating the interior of the chamber (backpressure of smaller than $10^{-5}$ Torr) to maintain purity of the films. As for the kinds of gases for forming films, a mixture gas of $SiH_4$, $N_2$ and $NH_3$ is used for forming the SiN film, a mixture gas of $SiH_4$ and hydrogen is used for forming the a-Si:H film, and a $PH_3$ gas diluted with hydrogen is used as a doping gas for forming the n+layer.

After the films are deposited as described above, the a-Si:H film is shaped like an island, followed by the deposition by sputtering of the source electrode, drain electrode, chromium layer 6 (400 angstroms) that serves as a coupling capacity-forming electrode, and aluminum layer 7 (3000 angstroms). Then, the source electrode 8, drain electrode 9, and coupling capacity-forming electrode 10 are formed by the photolithography method. Using these layers as a mask, furthermore, the n+a-Si:H film 5 on the channel is removed by etching.

The steps for producing the TFT is thus completed, and the operation of the transistor can then be confirmed. Here, however, an SiN passivation film (not shown) is further formed thereon to stabilize the characteristics. The contact to the electrodes is accomplished through the contact holes 11.

Typical conditions for biasing the transistor are as described below. That is, a voltage of 10 volts is applied to the drain electrode 9 and a voltage of 12 volts is applied to the coupling capacity-forming electrode 10 while grounding the source electrode 8. Further, the ratio of the gate insulator capacity to the coupling capacity of the channel portion is 5, i.e., W/L=100/10 μm for the transistor channel, and the area of the coupling capacity is 5000 μm$^2$ Therefore, a voltage of nearly 10 volts is applied to the gate electrode 2, and favorable transistor characteristics are observed.

Embodiment 2

Figure 2A:
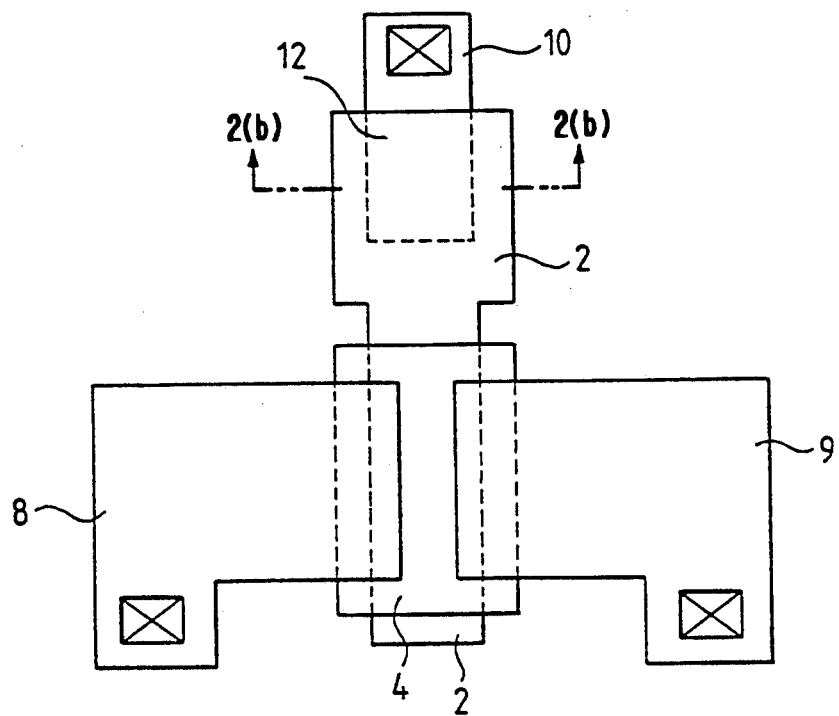
FIG. 2(a) is a plan view illustrating the constitution of another embodiment of the thin-film transistor of the present invention.
Figure 2B:
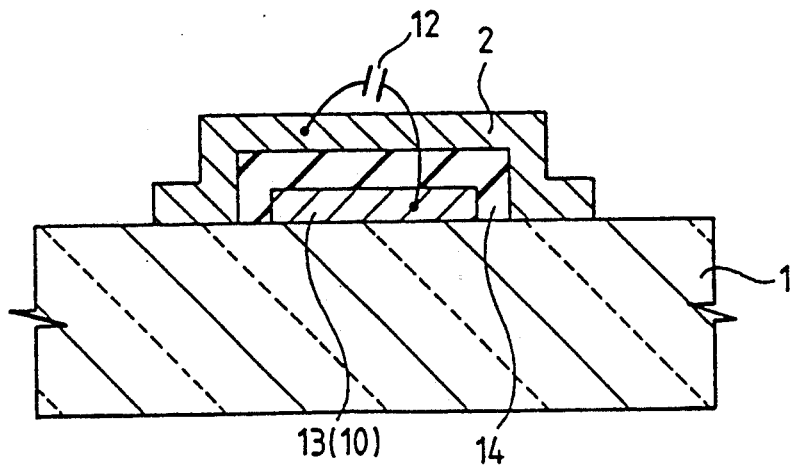
FIG. 2(b) is a section view along B-B' of FIG. 2(a)

FIGS. 2(a) and 2(b) are diagrams illustrating the constitution of another embodiment of the thin-film transistor of the present invention, wherein FIG. 2(a) is a plan view and FIG. 2(b) is a section view along B–B of FIG. 2(a).

Roughly described below is a procedure for producing the thin-film transistor of this constitution. First, aluminum is deposited by sputtering maintaining a thickness of 1700 angstroms on the glass substrate 1 and is then patterned to form a coupling capacity-forming electrode 13. Then, a photoresist is applied thereon maintaining a thickness of 3 μm, and is then removed except the contact portion and the voltage-supply electrode for anodic oxidation (not shown). Thereafter, the device is immersed in a solution for anodic oxidation with the voltage-supply electrode being left outside the solution. The solution for anodic oxidation is obtained by diluting a 3% tartaric acid solution with ethylene glycol, and adding ammonia water thereto to adjust the pH value to 7.0±0.5. After the device is immersed in the oxidizing solution, a voltage of 75 volts is applied to the voltage-supply electrode for oxidation for 30 minutes in order to form an Al$_2$O$_3$ film 14 maintaining a thickness of about 1000 angstroms on the surface of aluminum. In this case, the aluminum film having a thickness of 1700 angstroms is oxidized to a depth of 700 angstroms.

Then, chromium is deposited by sputtering maintaining a thickness of 1000 angstroms and is patterned to form the gate electrode 2. Thereafter, the SiN and a-Si:H films are deposited by the plasma CVD method to form the source and drain electrodes, which, however, is basically the same as the step that was described in the Embodiment 1. In this case, however, the gate insulating film and the insulating film for the coupling capacity are composed of SiN and Al$_2$O$_3$, respectively, and their thicknesses can be independently selected. In this case, furthermore, since the Al$_2$O$_3$ film serves as the insulator for the coupling capacity, it is possible to increase the coupling capacity by decreasing the film thickness to be smaller than that of the gate insulating film (SiN film). Further, Al$_2$O$_3$ has a relative permittivity of 9.0 which is greater than that (about 6.7) of SiN, and is advantageous from the standpoint of increasing the capacity.

Embodiment 3

Figure 3:
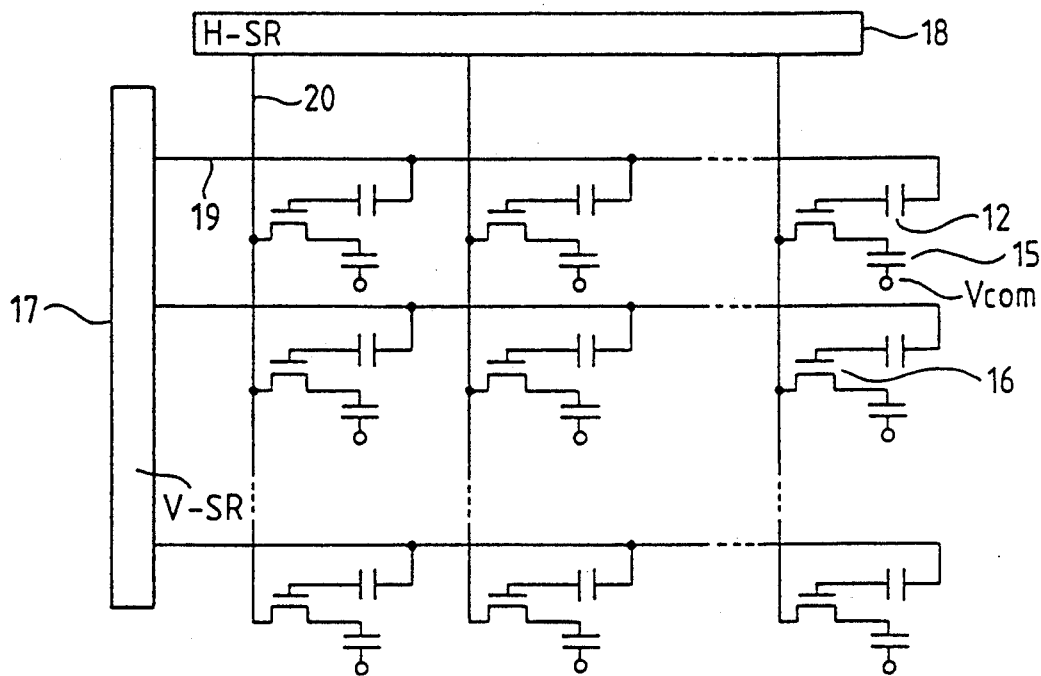
FIG. 3 is a diagram of matrix illustrating an array of thin-film transistors for switching the voltage applied to the pixels of a liquid crystal display and the liquid crystals according to the present invention.
Figure 4:
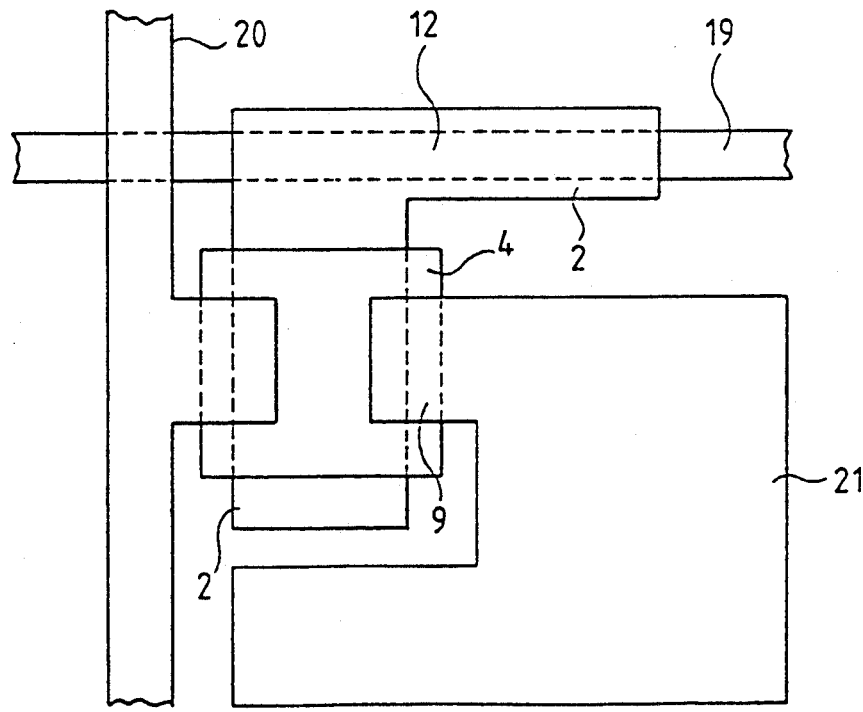
FIG. 4 is a plan view illustrating the constitution of a thin-film transistor portion in a pixel portion of FIG. 3.

FIGS. 3 and 4 illustrate the constitution of an embodiment of a display panel using thin-film transistors of the present invention.

First, FIG. 3 is a diagram of matrix showing the array of thin-film transistors (TFT) 16 for switching the voltage applied to the pixels of tie liquid crystal display and the liquid crystals 15. In FIG. 3, the TFT array corresponds to one of the two pieces of glass substrates for confining the liquid crystals which are represented by capacities 15. The coupling capacity 12 is connected in series with the gate electrode of the TFT 16 and is further connected to the gate bus line 19.

A signal voltage is applied as described below to the liquid crystals 15 that correspond to the pixels. That is, the voltage pulses are successively supplied from the vertical shift register 17 to the gate bus lines which are gate signal lines in order to select a bus line. In synchronism therewith, a signal voltage is supplied from the horizontal shift register 18 to the data lines 20 that are video signal lines. The signal voltage is applied to the pixel electrode pertaining to the selected gate bus line, i.e., applied to the liquid crystal corresponding to the pixel. In this case, the gate voltage is applied, via the coupling capacity, to the gate electrode of a transistor pertaining to the selected gate bus line, so that the transistor is rendered conductive. Symbol Vcom denotes a voltage applied to the common electrode of the liquid crystals.

FIG. 4 is a plan view of the TFT portion in the pixel portion of FIG. 3. Here, the gate bus line 19 which is the gate signal line is composed of aluminum like in the case of the embodiment 2, and the insulator for the coupling capacity 12 is composed of Al$_2$O$_3$ by the anodic oxidation like in the aforementioned embodiment. After the gate electrode 2 is formed, the SiN, a-Si:H and n$^+$a-Si:H layers are deposited by the plasma CVD method, the data line 20 which is the video signal line and the electrode 9 for pixel are formed by depositing chromium and aluminum by sputtering, and the transparent pixel electrode 21 is formed by using ITO (indium-tin-oxide). One of the features of this embodiment is that the coupling capacity 12 is formed on the gate bus line 19 in order to maintain an area necessary for constituting the coupling capacity without decreasing the numerical aperture of the pixels.

Though the present invention was described in the foregoing by way of embodiments, it should be noted that the gist of the invention is in no way limited thereto only.

That is, in the above embodiments, the active layer of TFT was composed of a-Si:H (hydrogenated amorphous silicon) which, however, may be composed of any other material such as a-Si alloy, tellurium, polysilicon or crystalline silicon. In the above-mentioned embodiments, furthermore, the gate oxide film and the insulator for the coupling capacitor were composed of SiN and Al$_2$O$_3$, which, however, may be reversed, or both of them may be composed of Al$_2$O$_3$. It is further allowable to use other insulators such as SiO$_2$, SiON, Ta$_2$O$_5$, and the like. Moreover, the forming method may be sputtering method, anodic oxidation method, thermal oxidation method, or a like method in addition to the CVD method. Furthermore, though the aforementioned embodiments have dealt with the arrays, it is allowable to apply the invention to the transistors of an integrated form, as a matter of course. Further, a semiconductor substrate may be used instead of the glass substrate.

When Ta$_2$O$_5$ is used for forming the coupling capacity, the following constitution can be effectively utilized. That is, the Ta$_2$O$_5$ film exhibits good insulating properties when it is thick (greater than 1000 angstroms). However, the Poole-Frenkel current starts to flow as the film thickness decreases (smaller than 1000 angstroms), and the effect of resistance component appears. That is, the film exhibits increased dielectric loss tan δ. If the area of the coupling capacity is relatively small (about 100 μm²) despite an increase in the dielectric loss tan δ, it could serve as a barrier to a sufficient degree against the defects due to shorts of the transistor. Therefore, use of the $Ta_2O_5$ film (about 500 angstroms in thickness) having a relatively large dielectric loss tan δ for forming the coupling capacity, makes it possible to accomplish the object of the present invention and serves as an effective means. Technology that uses the $Ta_2O_5$ film as a non-linear resistance with a relatively large dielectric loss tan δ has been discussed in the Proceedings of the Third International Display Research Conference (Japan Display, '83, October 3-5, 1983, Kobe), pp. 404-407.

According to the present invention which is concerned with the thin-film transistor of the constitution mentioned above and with the display panel that uses such transistors, the voltage is applied to the gate of the transistor via the coupling capacity. Namely, there are provided the thin-film transistor that develops little defects such as shorts caused by the presence of foreign matter, as well as the display panel using such transistors.

Further, materials of the insulator for forming capacity and the gate insulator, and thicknesses thereof, can be independently selected contribution to increasing the design and process margins. For instance, in order to increase the mutual conductance of the transistor, the thickness of the gate insulator should be decreased, and whereby the drivability can be increased. In the panel of the array shown in FIGS. 3 and 4, $Al_2O_3$ is used at intersecting portions of the gate bus lines and the data bus lines to increase the film thickness and, hence, to decrease the defects due to shorts, enabling the panel to be designed totally.

When the drivability is increased by decreasing the thickness of the gate insulating film as described above, it becomes possible to reduce the channel width of the transistor. Therefore, the overlapping area decreases between the source and the gate and between the drain and the gate, enabling the probability of defects due to shorts to be further decreased.

If a short develops between the data line and the gate, the data line and the gate bus line are short-circuited to develop line defect in the case of the array of transistors of the conventional structure. With the constitution of the present invention, on the other hand, line defect does not develop owing to the interposition of the coupling capacity, but point defect results at the worst. In this case, furthermore, since the coupling capacity is formed on the gate bus line, the numerical aperture of the panel is not affected, i.e., the numerical aperture does not decrease. According to the present invention, furthermore, the coupling capacity that is short-circuited does not pose any inconvenience making one of the features of the invention. Even when the coupling capacity is short-circuited, no defect develops as far as the transistor of the pixel is properly working.

The effect of the present invention can be further enhanced as a result of using a material that has a relative permittivity greater than that of the insulator for forming the coupling capacity. For instance, the $Ta_2O_5$ film which is an oxide of tantalum has a large relative permittivity (about 24) and gives the following advantages. That is, the mutual conductance of the transistor can, in general, be effectively increased by decreasing the thickness of the gate insulator. In order to effectively apply voltage to the gate electrode, the coupling capacity must be sufficiently greater than the gate insulator capacity. That is, if the thickness of the gate insulator is decreased in order to increase the mutual conductance of the transistor, then the gate insulator capacity increases and the coupling capacity must be increased correspondingly. An increase in the area of capacity to increase the coupling capacity adversely affects the numerical aperture. On the other hand, if $Ta_2O_5$ is used, a sufficiently large capacity can be maintained without the need of increasing the area of the coupling capacity because of its large relative permittivity. Therefore, the mutual conductance of the transistor can be increased while satisfying the so-called conflicting requirements.

This is concretely described below based on an example of FIG. 4. That is, if the transistor has a ratio $W/L = 2$, i.e., channel width $W = 20$ μm and the channel length $L = 10$ μm, and if the gate insulating film has a thickness of 1000 angstroms and the $Ta_2O_5$ insulator for forming the coupling capacity has a thickness of 1000 angstroms, then a sufficiently large coupling capacity (about 10 times as great as the gate insulator capacity) can be obtained by permitting the gate bus line to have a length of 60 μm (gate bus line width of 10 μm). This can be easily realized in the TFT matrix for liquid crystal display.

Further, the case where $Al_2O_3$ was used as an insulator for forming the coupling capacity mentioned in embodiments 2 and 3 can be evaluated as follows in terms of numerical values. That is, if $W//L = 40$ μm/10 μm, the gate insulating film (SiN) has a thickness of 2000 angstroms, the coupling capacity insulator ($Al_2O_3$) has a thickness of 1000 angstroms, and the gate bus line (width of 10 um) has a length of 150 μm, then it is allowed to obtain a sufficiently large coupling capacity (about 10 times as great as the gate insulator capacity). The value 150 μm is very proper in view of the fact that the pixel pitch is about 300 μm in the TFT matrix.

Further, an increase in the mutual conductance causes the amplitude of gate voltage to decrease. This gives great effects that the drive IC can be operated on a decreased voltage to consume reduced amounts of electric power.

Embodiment 4.

Figure 5:
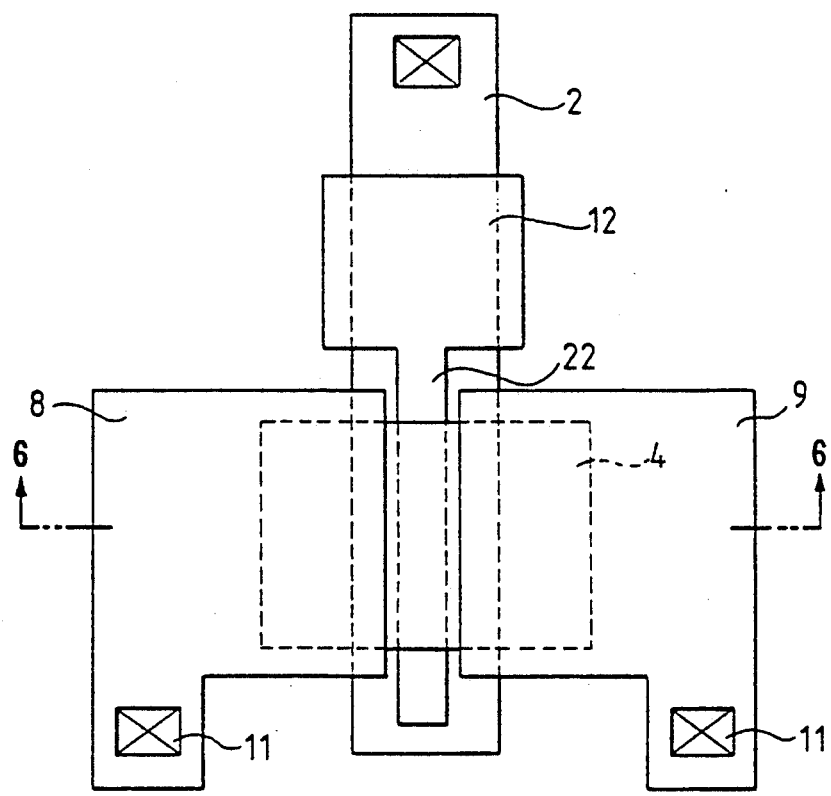
FIG. 5 is a plan view illustrating another embodiment of the present invention.
Figure 6:
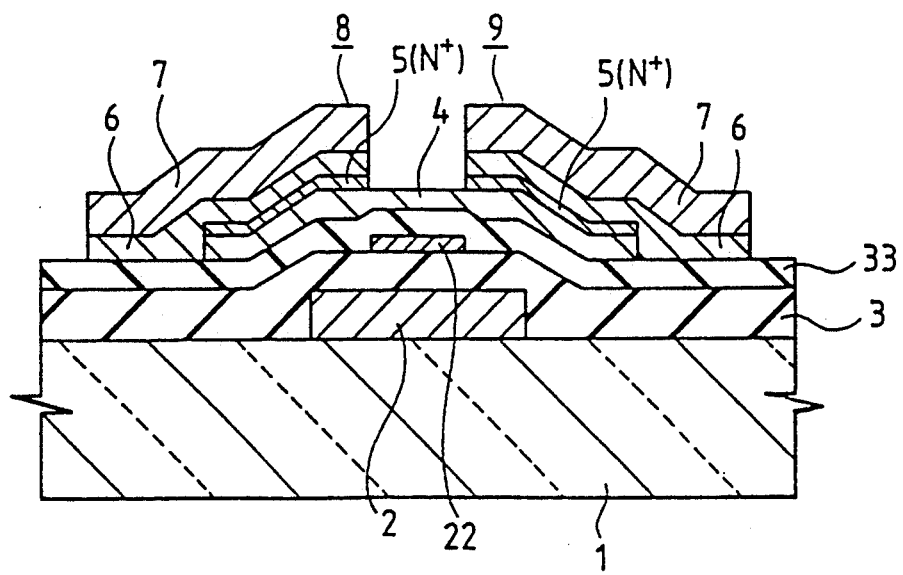
FIG. 6 is a section view along A-A' of FIG. 5.

FIG. 5 is a plan view of a fourth embodiment of the present invention, and FIG. 6 is a section view along A-A' of FIG. 5. This embodiment deals with a hydrogenated amorphous silicon thin-film transistor (a-Si:H TFT) formed on the glass substrate 1.

This transistor has the source electrode 8, the drain electrode 9, and the gate electrode which consists of a first gate electrode 2 and a second gate electrode 22. The second gate electrode 22 is coupled to the first gate electrode 2 in an AC manner via the coupling capacity 12.

The method of fabricating the thin-film transistor will now be describes.

Chromium is deposited maintaining a thickness of 1000 angstroms on the glass substrate 1. The first gate electrode pattern 2 is formed using the ordinary photolithographic technique. Then, an SiN film is deposited maintaining a thickness of 3000 angstroms by the plasma CVD method to form the gate insulating film 3, and chromium is deposited thereon maintaining a thickness of 400 angstroms followed by patterning to form the second gate electrode 22. As shown in Fig. 5, in this case, an overlapping portion of the first gate electrode and the second gate electrode is formed on the outside of the channel portion of the area of the overlapping portion in this case is 5000 $\mu m^2$.

Next, an SiN film is deposited maintaining a thickness of 400 angstroms to form the second gate insulator 33, an intrinsic a-Si:H film is deposited maintaining a thickness of 2000 angstroms to form the semiconductor layer 4, and an n+a-Si:H film is deposited maintaining a thickness of 400 angstroms to form the ohmic contact layer 7 by the plasma CVD method.

In the aforementioned steps, after the second gate insulator 33 was formed, the film formation was carried out while changing the kind of gas in the same chamber. To change the gas, the chamber is once evacuated (backpressure of smaller than $10^{-6}$ Torr) to maintain purity among the films. A mixture gas consisting of $SiH_4$, $N_2$ and $NH_3$ is used to form the SiN film, and a mixture gas consisting of $SiH_4$ and hydrogen is used to form the a-Si:H film. Further, the n+layer is doped using a $PH_3$ gas diluted with hydrogen.

After the films are deposited as described above, the a-Si:H film is shaped like an island, and then the chromium layer 6 and the aluminum layer 7 are formed by sputtering to form the source electrode and the drain electrode. The chromium layer 6 is 500 angstroms thick and the aluminum layer 7 is 4000 angstroms thick.

Figure 7:
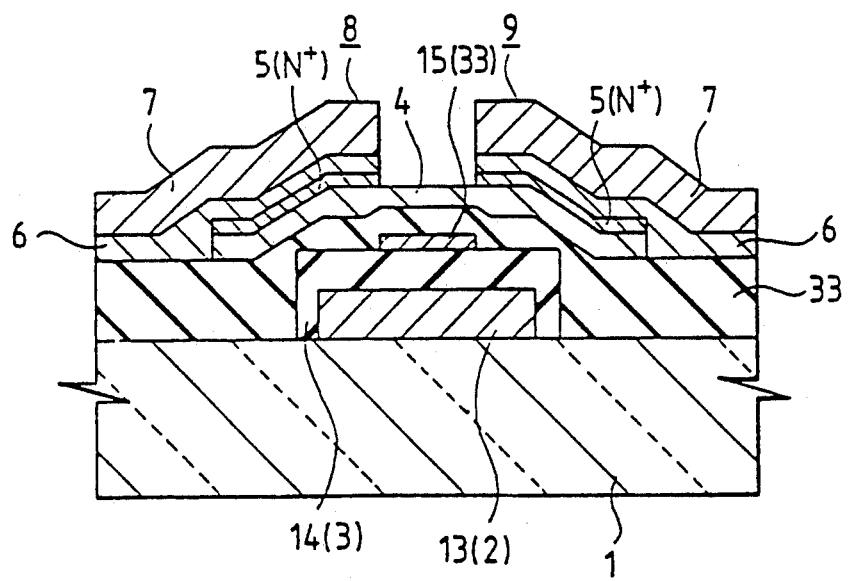
FIG. 7 is a section view illustrating a further embodiment of the present invention.

After the chromium and aluminum films are deposited as shown in FIG. 7, the chromium layer and the aluminum layer on the channel are removed in such a manner that the source electrode 10 and the drain electrode 11 are offset by about 1 $\mu m$ so will not to overlap the second gate electrode 22 but will overlap the first gate electrode 2 by more than 2 $\mu m$. Then, using them as a mask, the n+a-Si:H film 7 is removed by etching.

The TFT step is completed through the above-mentioned step, and the transistor operation can be confirmed. Here, however, an SiN passivation film (not shown) is further formed thereon in order to stabilize the characteristics.

Next, the operation and characteristics of the transistor of the present invention will be described.

Typical conditions for biasing the transistor are as described below. When a voltage of 10 volts is applied to the drain electrode and a bias voltage of 10 volts is applied to the first gate electrode with the source electrode being grounded, the current is as great as $Id = 10$ $\mu A$. The transistor has a ratio W/L of 7. The mobility is increased by about two to three times compared with that of the transistor having a single gate electrode.

This can be considered in a following way. When a gate voltage is applied to the first gate electrode, an electric field is applied to the semiconductor layer via the first gate insulator and the second gate insulator under the source electrode and the drain electrode, and the electrons are injected from the source electrode and a current flows into the drain electrode. On the other hand, a voltage is induced on the second gate electrode from the first gate electrode via the coupling capacity 12. This voltage enables the channel of the semiconductor to be formed. A voltage is induced on the second gate electrode though it is lower than that of when the voltage same as the first gate electrode is applied, which, however, is sufficient for forming the channel since the coupling capacity is great. This is because the second gate insulator has a reduced thickness.

Described below are the off-current characteristics of the transistor.

The transistor is usually formed offset. Due to the margin and the like in the masking step, however, the offset undergoes variation and is often extinguished or develop overlapping. That is, the source or the drain electrode overlaps the second gate electrode. In such a case, the off-current tends to increase in the previous applications mentioned earlier. When the overlapping exceeds 2 $\mu m$, the off-current jumps from smaller than $10^{-12}$ A up to greater than $10^{-10}$ A In the transistor or the present invention, however, the off-current is suppressed from increasing even when the overlapping develops.

Embodiment 5

FIG. 7 illustrates a further embodiment of the present invention. The feature of this embodiment resides in that the first electrode 13 is composed of aluminum, the first gate insulator 14 is composed of aluminum oxide, and the second gate electrode 15 is composed of n+a-Si.

The method of producing an aluminum-gate thin-film transistor has been disclosed in detail in PCT JP 90-01039 filed on August 13, 1990 designating the United States, and major points only will be described here.

First, aluminum (which may not necessarily be pure aluminum, but may be, for example, Al - 1% Pd or Al - 2% Si) is deposited by sputtering maintaining a thickness of 1700 angstroms on the insulating substrate 1, followed by patterning to form a gate wiring. Then, a photoresist is applied maintaining a thickness of 3 $\mu m$, and is then removed from the channel portion of the transistor and from the coupling capacity portion shown in the plan view of FIG. 5 by the photoetching process. The photoresist is left on the contact portion but is removed from the voltage-supply electrode.

The substrate is then immersed in an anodically oxidizing solution except the voltage-supply electrode. The oxidizing solution is obtained by diluting a 3% tartaric acid solution with ethylene glycol and adding ammonia water thereto to adjust the pH value to 7.0±0.5. After immersed in the oxidizing solution, a voltage of 75 volts is applied to the oxidizing voltage-supply electrode for 30 minutes in order to form $Al_2O_3$ 14 maintaining a thickness of about 1000 angstroms on the surface of aluminum. In this case, the aluminum which is 1700 angstroms thick is oxidized to a depth of 700 angstroms. The anodically oxidized film is formed on the channel portion and on the coupling capacity portion simultaneously, and no separate process is needed.

The second gate electrode 15 is composed of the n+a-Si layer that is 400 angstroms thick formed by the plasma CVD method. Like in FIG. 5, the n+a-Si layer is patterned by dry-etching to form the second gate electrode. The process thereafter is the same as that mentioned in the first embodiment.

In this case, $Al_2O_3$ which is the first gate insulator is formed by the wet process, and defects due to shorts develop little even when there exists foreign matter.

Though the present invention was described in the foregoing by way of embodiments, it should be noted that the gist of the invention is in no way limited thereto only. Further, though the active layer of TFT is composed of a-Si:H (amorphous silicon), it may be composed of any other material such as a-Si alloy, tellurium or polysilicon. The gate oxide film is not limited to SiN or $Al_2O_3$, either, but may be $SiO_2$, SiON, $Ta_2O_5$, or the like. Though the forgoing description has dealt with a single transistor, it needs not be pointed out that the invention can be also adapted to the transistors which are arrayed or integrated and to the panel of array for display. In these cases, the coupling capacity formed on the gate wiring (different from the channel portion) gives advantage.

The present invention is constituted as described in the foregoing and exhibits the following effects.

The gate electrode is constituted by two layers and the voltage is applied to the gate electrode (second gate electrode) of the channel side via the coupling capacity. Therefore, defects such as shorts develop little. That is, the device does not become defective unless both the channel portion and the coupling capacity portion become defective due to shorts. Therefore, the percent defective decreases strikingly.

Furthermore, the coupling capacity formed outside the channel region becomes greater than the capacity of the channel region, and the absorption of voltage due to the coupling capacity can be minimized. This can be relatively easily realized even in the panel of an array of transistors.

In the case of the conventional double-layer gate transistor, a contact hole must be provided to connect the first gate electrode and the second gate electrode together. The present invention, however, needs no contact hole, and whereby the process is simplified offering increased degree of freedom for the process assembly and increased freedom of design.

This becomes advantage in the array. The process is simplified by using the insulator between the first gate electrode and the second gate electrode in common with the insulator of the coupling capacity portion.

Finally, by using amorphous silicon as the active layer of the thin-film transistor, it is allowed to increase the area and to heighten the performance, enabling the device to be developed into a large display panel and the like.

It is further understood by those in the art that the foregoing description is preferred embodiment of the disclosed device and that various changes and modifications may be made in the invention without departing from the spirit and scope thereof.

What is claimed is:

1. A display panel comprising:
   a substrate, a plurality of thin-film transistors formed on the substrate, and a liquid crystal formed on the substrate,
   wherein each of said plurality of thin-film transistors includes:
   a gate electrode, a chanel region consisting of a semiconductor layer, a gate insulator formed between the gate electrode and the semiconductor layer, and a source electrode and a drain electrode formed on said semiconductor layer, wherein said gate electrode has a first gate electrode and a second gate electrode which are electrically insulated from each other, said first gate electrode being provided overlying said second gate electrode such that a coupling capacitance can be provided between the first and second gate electrodes, and a signal is applied to the second gate electrode so as to apply the signal to the first gate electrode via the coupling capacitance, the coupling capacitance being formed at least at a location away from the channel region.

2. A display panel according to claim 1 wherein the coupling capacitance is formed between an extension of said second gate electrode and an extension of said first gate electrode at a location away from the channel region.

3. A display panel according to claim 2, further comprising an insulator which enables the coupling capacitance to be achieved, said insulator being positioned between the first and second gate electrodes.

4. A display panel according to claim 2, wherein said channel region is composed of amorphous silicon.

5. A display panel according to claim 1, wherein said channel region is composed of amorphous silicon.

6. A display panel according to claim 1, further comprising an insulator which enables the coupling capacitance to be achieved, said insulator being positioned between the first and second gate electrodes.

7. A display panel according to claim 1, wherein said substrate is a semiconductor substrate.

8. A display panel according to claim 1, wherein said substrate is an insulating substrate.

9. A display panel according to claim 1, further comprising an insulator which enables the coupling capacitance to be achieved, the insulator being positioned between the first and second gate electrodes.

10. A display panel according to claim 9, wherein the second gate electrode is made of aluminum, and the insulator is made of an aluminum oxide formed by oxidation of aluminum of the second gate electrode.

11. A display panel according to claim 10, wherein the gate insulator is formed of silicon nitride.

12. A display panel according to claim 9, wherein the insulator which enables the coupling capacitance to be achieved is smaller in thickness than the thickness of the gate insulator.

13. A display panel according to claim 9, wherein the coupling capacitance between the first and second gate electrodes, through the insulator, is greater than a capacitance between the first gate electrode and the channel region, through the gate insulator.

14. A display panel according to claim 1, wherein the source and drain electrodes do not overlap the first gate electrode but do overlap the second gate electrode.

15. A display panel according to claim 14, wherein the second gate electrode is provided on the substrate and the first gate electrode is provided overlying the second gate electrode.

16. A display panel according to claim 1, wherein the second gate electrode is formed of aluminum and the first gate electrode is formed of doped amorphous silicon.

17. A display panel according to claim 16, further comprising an insulator which enables the coupling capacitance to be achieved, between the first and second gate electrodes, and wherein the insulator which enables the coupling capacitance to be achieved is formed of aluminum oxide.

18. A display panel comprising:
   a substrate, a plurality of thin-film transistors formed on the substrate, and a liquid crystal formed on the substrate,
   wherein each of said plurality of thin-film transistors includes:
   a gate electrode, a channel region consisting of a semiconductor layer, a gate insulator formed between the gate electrode and the semiconductor layer, a source electrode and a drain electrode formed on said semiconductor layer, and a gate signal line that applies signals to said gate electrode, wherein said gate electrode and said gate signal line are electrically insulated from each other, a coupling capacitance is provided between said gate electrode and said gate signal line at a location away from said channel region, and a signal is applied to the gate signal line, such that a voltage is applied to said gate electrode via said coupling capacitance.

19. A display panel according to claim 18, wherein said substrate is an insulating substrate, and said semiconductor layer is composed of amorphous silicon.

20. A display panel according to claim 18, wherein provision is further made of a plurality of video signal lines, said gate signal line is provided in a plural number, said plurality of video signal lines and the plural number of gate signal lines are arranged in the form of a matrix, a video signal is input to either the source electrode or the drain electrode, and a pixel electrode is electrically connected to the other one of either the source electrode is electrically connected to electrode, thereby to constitute the display panel.

21. A display panel according to claim 18, further comprising an insulator provided between the gate electrode and the gate signal line, so as to enable said coupling capacitance to be achieved, said insulator being comprised of $Al_2O_3$.

22. A display panel according to claim 18, further comprising an insulator provided between the gate electrode and the gate signal line, so as to enable said coupling capacitance to be achieved, said insulator being comprised of $Ta_2O_5$.

23. A display panel according to claim 20, wherein said substrate is a semiconductor substrate.

24. A display panel according to claim 20, wherein said substrate is an insulating substrate, and said semiconductor layer is composed of amorphous silicon.

25. A display panel according to claim 20, further comprising an insulator provided between the gate electrode and the gate signal line, so as to enable said coupling capacitance to be achieved, said insulator being comprised of $Ta_2O_5$.

26. A display panel according to claim 20, wherein said substrate is a semiconductor substrate.

27. A display panel according to claim 20, further comprising an insulator provided between the gate electrode and the gate signal line, so as to enable said coupling capacitance to be achieved, said insulator being comprised of $Al_2O_3$.

28. A display panel according to claim 1, wherein said second gate electrode forms part of a gate bus line of the display panel.

29. A display panel according to claim 1, further comprising transparent pixel electrodes, with each transparent pixel electrode being electrically connected to the drain electrode of a respective thin-film transistor.

30. A display panel according to claim 3, wherein said insulator is thinner than said gate insulator.

31. A display panel according to claim 1, wherein said gate insulator is between the first gate electrode and the channel region.

32. A display panel according to claim 31, further comprising an insulator which enables the coupling capacitance to be achieved, said insulator being positioned between the first and second gate electrodes.

33. A display panel according to claim 32, wherein said insulator is thinner than said gate insulator.

34. A display panel according to claim 32, wherein the gate insulator and the insulator respectively are comprised of silicon nitride and aluminum oxide.

35. A display panel according to claim 1, wherein the source and drain electrodes overlap with the second gate electrode, but do not overlap with the first gate electrode.

* * * * *